US011770905B2

(12) United States Patent
Zhou

(10) Patent No.: US 11,770,905 B2
(45) Date of Patent: Sep. 26, 2023

(54) METHOD, SYSTEM AND DEVICE FOR MANUFACTURING PRINTED CIRCUIT BOARD, AND COMPUTER STORAGE MEDIUM

(71) Applicant: INSPUR SUZHOU INTELLIGENT TECHNOLOGY CO., LTD., Jiangsu (CN)

(72) Inventor: Dong Zhou, Jiangsu (CN)

(73) Assignee: INSPUR SUZHOU INTELLIGENT TECHNOLOGY CO., LTD., Jiangsu (CN)

(*) Notice: Subject to any disclaimer, the term of this patent is extended or adjusted under 35 U.S.C. 154(b) by 0 days.

(21) Appl. No.: 17/757,985

(22) PCT Filed: Feb. 23, 2021

(86) PCT No.: PCT/CN2021/077440
§ 371 (c)(1),
(2) Date: Jun. 24, 2022

(87) PCT Pub. No.: WO2021/253860
PCT Pub. Date: Dec. 23, 2021

(65) Prior Publication Data
US 2023/0123173 A1    Apr. 20, 2023

(30) Foreign Application Priority Data
Jun. 19, 2020   (CN) .......................... 202010568682.1

(51) Int. Cl.
*H05K 3/42*   (2006.01)
*H05K 3/00*   (2006.01)
(52) U.S. Cl.
CPC ........... *H05K 3/429* (2013.01); *H05K 3/0005* (2013.01); *Y10T 29/49165* (2015.01)

(58) Field of Classification Search
CPC .......... H01L 2924/15312; H01L 33/62; H05K 2201/0969; H05K 3/429; H05K 7/205;
(Continued)

(56) References Cited

U.S. PATENT DOCUMENTS 5,243,547 A    9/1993  Tsai et al.
8,429,594 B2   4/2013  Mori et al.
(Continued)

FOREIGN PATENT DOCUMENTS

CN    101341806 A    1/2009
CN    101583250 A    11/2009
(Continued)

OTHER PUBLICATIONS

First Office Action cited in CN202010568682.1, dated Mar. 24, 2021.

*Primary Examiner* — Thiem D Phan
(74) *Attorney, Agent, or Firm* — COOPER LEGAL GROUP, LLC

(57) ABSTRACT

Disclosed are a method, system and device for manufacturing a printed circuit board, and a computer storage medium. The method comprises: acquiring a printed circuit board to be manufactured which includes a via hole; acquiring shape information of the via hole; acquiring connection information of circuit layers in said printed circuit board; assembling preset conducting devices according to the connection information and the shape information, so as to obtain a target conducting device that matches the connection information and the shape information; guiding the target conducting device into the via hole to obtain a conducting printed circuit board; and connecting the conducting printed circuit board to obtain a target printed circuit board, wherein the types of
(Continued)

the preset conducting devices comprise a metal conducting device, a non-metal conducting device and a semi-metal conducting device.

16 Claims, 3 Drawing Sheets

(58) Field of Classification Search
CPC ......... Y10T 29/49126; Y10T 29/49139; Y10T 29/49165; Y10T 29/4913; Y10T 29/49144; Y10T 29/49155; H01R 13/03
USPC ......... 29/852, 825, 829, 837, 846, 849, 851, 29/854
See application file for complete search history.

(56) References Cited

U.S. PATENT DOCUMENTS

| | | | |
|---|---|---|---|
| 8,566,773 B2 * | 10/2013 | Christo | G06F 30/398 |
| | | | 716/132 |
| 10,154,581 B2 | 12/2018 | Becker et al. | |
| 10,561,020 B2 * | 2/2020 | Doyle | H05K 1/181 |
| 2005/0085065 A1 | 4/2005 | Mok et al. | |
| 2006/0090933 A1 | 5/2006 | Wig et al. | |
| 2007/0079276 A1 | 4/2007 | Ashida et al. | |
| 2009/0049414 A1 | 2/2009 | Mutnury et al. | |
| 2011/0017505 A1 | 1/2011 | Hardin et al. | |
| 2011/0078643 A1 | 3/2011 | Sheng | |
| 2012/0261178 A1 | 10/2012 | Kusumoto et al. | |
| 2015/0101846 A1 | 4/2015 | Kang et al. | |
| 2015/0180104 A1 | 6/2015 | Ao et al. | |

FOREIGN PATENT DOCUMENTS

| | | |
|---|---|---|
| CN | 102033973 A | 4/2011 |
| CN | 102598003 A | 7/2012 |
| CN | 104284528 A | 1/2015 |
| CN | 105357903 A | 2/2016 |
| CN | 105592626 A | 5/2016 |
| CN | 106304654 A | 1/2017 |
| CN | 111031709 A | 4/2020 |
| CN | 111642085 A | 9/2020 |
| JP | 5660044 B2 | 1/2015 |

* cited by examiner

METHOD, SYSTEM AND DEVICE FOR MANUFACTURING PRINTED CIRCUIT BOARD, AND COMPUTER STORAGE MEDIUM

CROSS-REFERENCE TO RELATED APPLICATION

This application claims priority to Chinese Patent Application No. 202010568682.1, filed on Jun. 19, 2020, in China National Intellectual Property Administration and entitled "Method, System, and Device for Manufacturing Printed Circuit Board, and Computer Storage Medium", the contents of which are hereby incorporated by reference in its entirety.

FIELD

The present application relates to the technical field of manufacturing of Printed Circuit Boards (PCBs), and more particularly to a method, system, and device for manufacturing a PCB, and a computer storage medium.

BACKGROUND

With the development of electronic information, functions of electronic products have been enriched increasingly, and signal frequencies and signal speeds have been increased correspondingly. During the design of a PCB, signal integrity design is a key and difficult point. Particularly, requirements for signal reflection have increased. Via stub in signal reflection has received attention gradually.

In order to reduce signal reflection of a PCB, it is necessary to reduce via stubs. Currently, via stubs are reduced by a back-drilling process.

However, when via stubs are reduced by the back-drilling process, a remaining condition of the via stubs is affected by the operation accuracy. Therefore, requirements for the operation of the back-drilling process are relatively high, and the back-drilling process is quite difficult to implement.

In summary, how to reduce via stubs in a PCB conveniently is a problem urgent to be solved by those skilled in the art at present.

SUMMARY

An objective of the present application is to provide a method for manufacturing a PCB, so as to solve the technical problem of how to reduce via stubs in a PCB conveniently to some extents. The present application also provides a system and device for manufacturing a PCB, a computer-readable storage medium.

In order to achieve the above objective, the present application provides the following technical solutions.

A method for manufacturing a PCB is provided, including:
acquiring a PCB to be manufactured including a via;
acquiring shape information of the via;
acquiring connection information of each circuit layer in the PCB to be manufactured;
assembling preset conducting devices according to the connection information and the shape information and obtaining a target conducting device matched with the connection information and the shape information;
guiding the target conducting device into the via and obtaining a conducting PCB;
connecting the conducting PCB and obtaining a target PCB;

wherein, the preset conducting device includes one or more of a metal conducting device, a nonmetal conducting device, a semi-metal conducting device.

In one aspect, the assembling preset conducting devices according to the connection information and the shape information and obtaining a target conducting device matched with the connection information and the shape information includes:
determining, based on the connection information, an adjacent first circuit layer and second circuit layer to be connected in the circuit layers of the PCB to be manufactured;
determining an intermediate circuit layer between the first circuit layer and the second circuit layer based on distribution positions of the circuit layers of the PCB to be manufactured;
setting conducting devices corresponding to the first circuit layer, the second circuit layer, and the intermediate circuit layer as metal conducting devices or semi-metal conducting devices;
setting a conducting device corresponding to another circuit layer except the first circuit layer, the second circuit layer, and the intermediate circuit layer as a nonmetal conducting device;
setting shapes of the conducting devices corresponding to the circuit layers of the PCB to be manufactured according to the shape information;
assembling the conducting devices corresponding to the circuit layers of the PCB to be manufactured according to the distribution positions of the circuit layers of the PCB to be manufactured, and obtaining the target conducting device.

In one aspect, the setting conducting devices corresponding to the first circuit layer, the second circuit layer, and the intermediate circuit layer as metal conducting devices or semi-metal conducting devices includes:
parsing a type of the connection information;
in case that the connection information represents that the first circuit layer is selectively connected with the second circuit layer and another circuit layer selectively connected with the first circuit layer is a third circuit layer, setting a conducting device corresponding to the third circuit layer as a semi-metal conducting device, setting all of the conducting devices corresponding to the first circuit layer, the intermediate circuit layer, and the second circuit layer as metal conducting devices;
setting all of the conducting devices corresponding to the first circuit layer, the second circuit layer, and the intermediate circuit layer as metal conducting devices in case that the connection information represents that the first circuit layer is fully connected with the second circuit layer.

In one aspect, a shape of the via is a cube, the preset conducting device is a columnar device.

In one aspect, the guiding the target conducting device into the via includes:
guiding the target conducting device into the via by injection.

In one aspect, a structure of the preset conducting device is a hollow structure.

In one aspect, the connecting the conducting PCB and obtaining a target PCB includes:
injecting a conducting medium from one end to the other end of the target conducting device and obtaining the target PCB.

A system for manufacturing a PCB is provided, including:
a first acquisition module, configured to acquire a PCB to be manufactured including a via;
a second acquisition module, configured to acquire shape information of the via;
a third acquisition module, configured to acquire connection information of each circuit layer in the PCB to be manufactured;
a first assembling module, configured to assemble preset conducting devices according to the connection information and the shape information and obtain a target conducting device matched with the connection information and the shape information;
a first guide-in module, configured to guide the target conducting device into the via and obtain a conducting PCB;
a first connection module, configured to connect the conducting PCB and obtain a target PCB,
wherein the preset conducting device includes one or more of a metal conducting device, a nonmetal conducting device, a semi-metal conducting device.

A device for manufacturing a PCB is provided, including:
a memory, configured to store a computer program;
a processor, configured to execute the computer program to implement any steps of the method for manufacturing a PCB as described above.

A computer-readable storage medium is provided, storing a computer program which is executed by a processor to implement any steps of the method for manufacturing a PCB as described above.

The method for manufacturing a PCB in the present application, acquires a PCB to be manufactured including a via; acquire a shape information of the via; acquire a connection information of each circuit layer in the PCB to be manufactured; assembles preset conducting devices according to the connection information and the shape information and obtains a target conducting device matched with the connection information and the shape information; guides the target conducting device into the via, obtains a conducting PCB connects the conducting PCB, obtains a target PCB; wherein, a type of the preset conducting device includes a metal conducting device, a nonmetal conducting device, a semi-metal conducting device.

BRIEF DESCRIPTION OF THE DRAWINGS

In order to describe the technical solutions in embodiments of the present application or the prior art more clearly, the drawings required to be used in descriptions about the embodiments or the prior art will be introduced briefly below. Apparently, the drawings in the description below are only the embodiments of the present application. Those ordinarily skilled in the art may further obtain other drawings according to the provided drawings without creative work.

DETAILED DESCRIPTION

The technical solutions in the embodiments of the present application will be described clearly and completely below in combination with the drawings in the embodiments of the present application. Clearly, the described embodiments are not all but only part of embodiments of the present application. All other embodiments obtained by those ordinarily skilled in the art based on the embodiments in the present application without creative work shall fall within the scope of protection of the present application.

Figure 1:
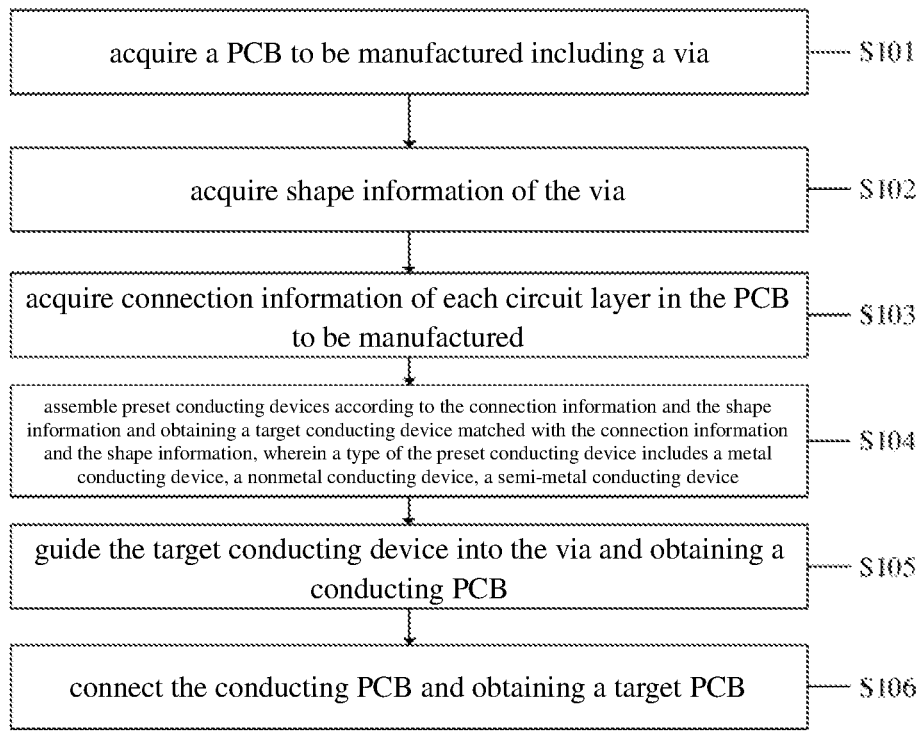
FIG. 1 is a flowchart of a method for manufacturing a PCB according to an embodiment of the present application.

Referring to FIG. 1, FIG. 1 is a flowchart of a method for manufacturing a PCB according to an embodiment of the present application.

The method for manufacturing a PCB in the embodiment of the present application may include the following steps:

Step S101: acquiring a PCB to be manufactured including a via.

In practical applications, a PCB to be manufactured including a via may be acquired first. That is, a PCB where only a via is formed after an original PCB is drilled may be acquired first.

Step S102: acquiring shape information of the via.

In practical applications, after the PCB to be manufactured including the via is acquired, shape information of the via may be acquired first, so as to fill the via subsequently according to the shape information of the via.

Step S103: acquiring connection information of each circuit layer in the PCB to be manufactured.

In practical applications, after the shape information of the via is acquired, connection information of each circuit layer in the PCB to be manufactured also needs to be acquired, so as to set a corresponding connection relationship for the PCB to be manufactured according to the connection information of each circuit layer.

Step S104: assembling preset conducting devices according to the connection information and the shape information and obtaining a target conducting device matched with the connection information and the shape information, wherein a type of the preset conducting device includes a metal conducting device, a nonmetal conducting device, a semi-metal conducting device.

In practical applications, after the connection information of each circuit layer in the PCB to be manufactured is acquired, it may assemble preset conducting devices according to the connection information and the shape information, and obtain a target conducting device matched with the connection information and the shape information, such that the target conducting device may not only be guided into the via to fill the via completely but also meet a connection requirement between the circuit layers. In the present application, a type of the preset conducting device includes a metal conducting device, a nonmetal conducting device, a semi-metal conducting device, so diversified connection information between the circuit layers may be satisfied.

Step S105: guiding the target conducting device into the via and obtaining a conducting PCB.

In practical applications, after the target conducting device is obtained, it may guide the target conducting device into the via so as to fill the via completely, obtain a conducting PCB including no via stubs, and avoid remaining via stubs.

Step S106: connecting the conducting PCB and obtaining a target PCB.

In practical applications, after the conducting PCB is obtained, the conducting PCB is not connected internally. For example, each circuit layer is not connected by the target conducting device. Therefore, it needs to further connect the conducting PCB and obtain a target PCB including no via stubs and meeting the corresponding connection requirement.

The method for manufacturing a PCB in the present application, acquires a PCB to be manufactured including a via; acquires shape information of the via; acquires connection information of each circuit layer in the PCB to be manufactured; assembles preset conducting devices according to the connection information and the shape information, obtains a target conducting device matched with the connection information and the shape information; guides the target conducting device into the via, obtains a conducting PCB; connects the conducting PCB, obtains a target PCB; wherein, a type of the preset conducting device includes a metal conducting device, a nonmetal conducting device, a semi-metal conducting device. In the present application, after the PCB to be manufactured including the via is acquired, the PCB to be manufactured is not back-drilled, and instead, the preset conducting devices are assembled into the target conducting device matched therewith according to the shape information of the via and the connection information of the circuit layers, and the target conducting device is guided into the via, so there is no via stub in the via, and it is only necessary to assemble the preset conducting devices, so convenience is brought to implementation.

In the method for manufacturing a PCB in the embodiment of the present application, the metal conducting device has conductive connectivity, the nonmetal conducting device has no conductive connectivity, and the semi-metal conducting device partially has conductive connectivity, whereby the metal conducting device, the nonmetal conducting device, and the semi-metal conducting device are assembled flexibly according to the connection information of the circuit layers to obtain the target conducting device meeting the connection requirement. That is, in the process that preset conducting devices are assembled according to the connection information and the shape information to obtain a target conducting device matched with the connection information and the shape information it may connect an adjacent first circuit layer and second circuit layer in the circuit layers of the PCB to be manufactured are determined based on the connection information; determine an intermediate circuit layer between the first circuit layer and the second circuit layer based on distribution positions of the circuit layers of the PCB to be manufactured; set conducting devices corresponding to the first circuit layer, the second circuit layer, and the intermediate circuit layer as metal conducting devices or semi-metal conducting devices; set a conducting device corresponding to another circuit layer except the first circuit layer, the second circuit layer, and the intermediate circuit layer as a nonmetal conducting device; set shapes of the conducting devices corresponding to the circuit layers of the PCB to be manufactured according to the shape information; assemble the conducting devices corresponding to the circuit layers of the PCB to be manufactured according to the distribution positions of the circuit layers of the PCB to be manufactured, and obtain the target conducting device.

In practical applications, the target conducting device is for meeting the connection relationship between the circuit layers, whereby a composition structure of the target conducting device may be determined according to a type of the connection information. That is, the process that conducting devices corresponding to the first circuit layer, the second circuit layer, and the intermediate circuit layer are set as metal conducting devices or semi-metal conducting devices may specifically be: parsing a type of the connection information; in case that the connection information represents that the first circuit layer is selectively connected with the second circuit layer and another circuit layer selectively connected with the first circuit layer is a third circuit layer, setting a conducting device corresponding to the third circuit layer as a semi-metal conducting device, setting all of the conducting devices corresponding to the first circuit layer, the intermediate circuit layer, and the second circuit layer as metal conducting devices; setting all of the conducting devices corresponding to the first circuit layer, the second circuit layer, and the intermediate circuit layer as metal conducting devices in case that the connection information represents that the first circuit layer is fully connected with the second circuit layer.

Figure 2:
FIG. 2 is a style diagram of a metal conducting device.
Figure 3:
FIG. 3 is a style diagram of a nonmetal conducting device.
Figure 4:
FIG. 4 is a style diagram of a semi-metal conducting device.
Figure 5:
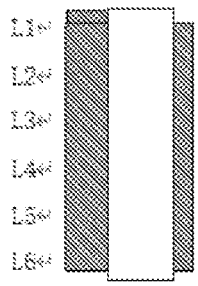
FIG. 5 is a style diagram of a PCB to be manufactured.
Figure 6:
FIG. 6 is a style diagram of a target conducting device satisfying that Layer 1 (L1) is connected with Layer 4 (L4)
Figure 7:
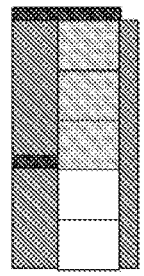
FIG. 7 is a style diagram of a target PCB representing that L1 is connected with L4.
Figure 8:
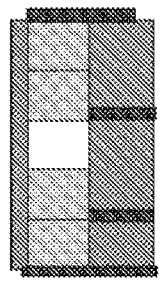
FIG. 8 is a style diagram of a target PCB representing that L1 is connected with Layer 3 (L3) and Layer 5 (L5) is connected with Layer 6 (L6)
Figure 9:
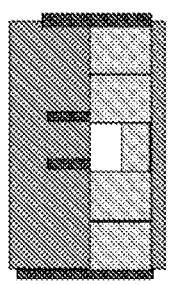
FIG. 9 is a style diagram of a target PCB representing that L1 is selectively connected with L3.
Figure 10:
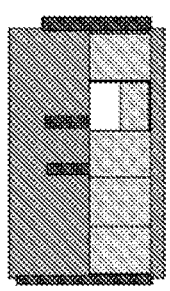
FIG. 10 is a style diagram of a target PCB representing that L1 is selectively connected with L4.

For ease of understanding, a generation process of the target conducting device will now be described in combination with the drawings. It is assumed that a style of the metal conducting device is as shown in FIG. 2, a style of the nonmetal conducting device is as shown in FIG. 3, a style of the semi-metal conducting device is as shown in FIG. 4, it is assumed that a style of the PCB to be manufactured is as shown in FIG. 5, the white region in FIG. 5 is the via, L1, L2, L3, L4, L5, L6 represent the corresponding circuit layers. When the connection information of the PCB to be manufactured represents that L1 is connected with L4, it may set conducting devices corresponding to L2, L3, and L4 as metal conducting devices, and set conducting devices corresponding to the other circuit layers as nonmetal conducting devices, whereby a structure of the target conducting device may be as shown in FIG. 6, and a shape of the finally obtained target PCB may be as shown in FIG. 7; when the connection information of the PCB to be manufactured represents that L1 is connected with L3 and L5 is connected with L6, it may set the conducting devices corresponding to L2 and L3 as metal conducting devices, set the conducting devices corresponding to L5 and L6 as metal conducting devices, and set the conducting devices corresponding to the other circuit layers as nonmetal conducting devices, the structure of the finally obtained target PCB may be as shown in FIG. 8; when the connection information of the PCB to be manufactured represents that L1 is selectively connected with L3 or L4, and L1 is selectively connected with L3, it may set the conducting devices corresponding to L2 and L3 as metal conducting devices, set the conducting device corresponding to L4 as a semi-metal conducting device, and set the conducting devices corresponding to the other circuit layers as nonmetal conducting devices, the structure of the finally obtained target PCB may be as shown in FIG. 9; when the connection information of the PCB to be manufactured represents that L1 is connected with L3 or L4, and L1 is selectively connected with L4, it may set the conducting devices corresponding to L2 and L4 as metal conducting devices, set the conducting device corresponding to L3 is a semi-metal conducting device, and set the conducting devices corresponding to the other circuit layers as nonmetal conducting devices, the structure of the finally obtained target PCB may be as shown in FIG. 10. FIGS. 9 and 10 show that, when the PCB needs selective connection, the preset conducting devices may be assembled flexibly without changing the structure of the PCB to implement selective connection, that is, it is only necessary to change the target conducting device, an implementation process is simple.

In the method for manufacturing a PCB in the embodiment of the present application, in order to make it convenient to manufacture the conducting device and guide the target conducting device into the via, a shape of the via may be a cube, the preset conducting device is a columnar device. For example, both the via and the preset conducting device may be shaped into cubes.

In practical applications, in order to guide the target conducting device into the via conveniently, the target conducting device may be guided into the via by injection.

In practical applications, for ease of carrying, as well as conduction of the preset conducting device, a structure of the preset conducting device in the present application may be a hollow structure. Correspondingly, when connecting the conducting PCB and obtaining the target PCB, it may plug the other end of the target conducting device, inject a conducting medium from one end to the other end of the target conducting device, and obtain the target PCB.

Figure 11:
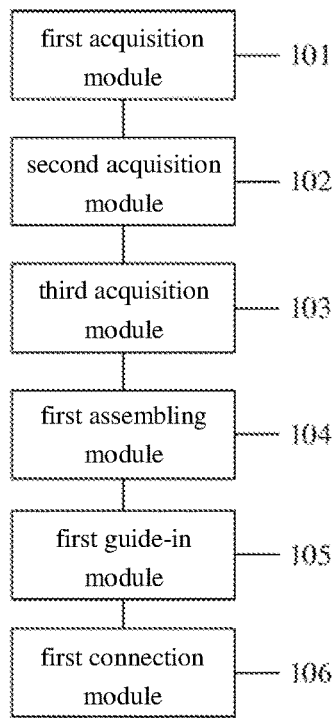
FIG. 11 is a schematic structural diagram of a system for manufacturing a PCB according to an embodiment of the present application.

Referring to FIG. 11, FIG. 11 is a schematic structural diagram of a system for manufacturing a PCB according to an embodiment of the present application.

The system for manufacturing a PCB in the embodiment of the present application may include:
- a first acquisition module 101, configured to acquire a PCB to be manufactured including a via;
- a second acquisition module 102, configured to acquire shape information of the via;
- a third acquisition module 103, configured to acquire connection information of each circuit layer in the PCB to be manufactured;
- a first assembling module 104, configured to assemble preset conducting devices according to the connection information and the shape information and obtain a target conducting device matched with the connection information and the shape information;
- a first guide-in module 105, configured to guide the target conducting device into the via and obtain a conducting PCB;
- a first connection module 106, configured to connect the conducting PCB and obtain a target PCB,
- wherein a type of the preset conducting device includes a metal conducting device, a nonmetal conducting device, a semi-metal conducting device.

According to the system for manufacturing a PCB in the embodiment of the present application, the first assembling module may include:
- a first determination submodule, configured to determine, based on the connection information, an adjacent first circuit layer and second circuit layer to be connected in the circuit layers of the PCB to be manufactured;
- a second determination submodule, configured to determine an intermediate circuit layer between the first circuit layer and the second circuit layer based on distribution positions of the circuit layers of the PCB to be manufactured;
- a first setting submodule, configured to set conducting devices corresponding to the first circuit layer, the second circuit layer, and the intermediate circuit layer as metal conducting devices or semi-metal conducting devices;
- a second setting submodule, configured to set a conducting device corresponding to another circuit layer except the first circuit layer, the second circuit layer, and the intermediate circuit layer as a nonmetal conducting device;
- a third setting submodule, configured to set shapes of the conducting devices corresponding to the circuit layers of the PCB to be manufactured according to the shape information;
- a first assembling submodule, configured to assemble the conducting devices corresponding to the circuit layers of the PCB to be manufactured according to the distribution positions of the circuit layers of the PCB to be manufactured and obtain the target conducting device.

According to the system for manufacturing a PCB in the embodiment of the present application, the first setting submodule may include:
- a first parsing unit, configured to parse a type of the connection information; in case that the connection information represents that the first circuit layer is selectively connected with the second circuit layer and another circuit layer selectively connected with the first circuit layer is a third circuit layer, set a conducting device corresponding to the third circuit layer as a semi-metal conducting device, and set all of the conducting devices corresponding to the first circuit layer, the intermediate circuit layer, and the second circuit layer as metal conducting devices; set all of the conducting devices corresponding to the first circuit layer, the second circuit layer, and the intermediate circuit layer as metal conducting devices in case that the connection information represents that the first circuit layer is fully connected with the second circuit layer.

According to the system for manufacturing a PCB in the embodiment of the present application, a shape of the via may be a cube, the preset conducting device is a columnar device.

According to the system for manufacturing a PCB in the embodiment of the present application, the first guide-in module may include:
- a first guide-in unit, configured to guide the target conducting device into the via by injection.

According to the system for manufacturing a PCB in the embodiment of the present application, a structure of the preset conducting device may be a hollow structure.

According to the system for manufacturing a PCB in the embodiment of the present application, the first connection module may include:
- a first injection unit, configured to inject a conducting medium from one end to the other end of the target conducting device and obtain the target PCB.

Figure 12:
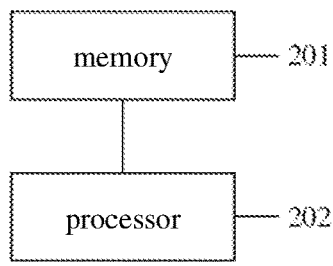
FIG. 12 is a schematic structural diagram of a device for manufacturing a PCB according to an embodiment of the present application.

The present application also provides a device for manufacturing a PCB and a computer-readable storage medium, both of which have corresponding effects of the method for manufacturing a PCB in the embodiments of the present application. Referring to FIG. 12, FIG. 12 is a schematic structural diagram of a device for manufacturing a PCB according to an embodiment of the present application.

The device for manufacturing a PCB in the embodiment of the present application includes a memory 201 and a processor 202. The memory 201 stores a computer program. The processor 202 executes the computer program to implement the following steps:

acquiring a PCB to be manufactured including a via;
acquiring shape information of the via;
acquiring connection information of each circuit layer in the PCB to be manufactured;
assembling preset conducting devices according to the connection information and the shape information, and obtaining a target conducting device matched with the connection information and the shape information;
guiding the target conducting device into the via and obtaining a conducting PCB;
connecting the conducting PCB and obtaining a target PCB,
wherein a type of the preset conducting device includes a metal conducting device, a nonmetal conducting device, a semi-metal conducting device.

The device for manufacturing a PCB in the embodiment of the present application includes a memory 201 and a processor 202. The memory 201 stores a computer program. The processor 202 executes the computer program to implement the following steps: determining, based on the connection information, an adjacent first circuit layer and second circuit layer to be connected in the circuit layers of the PCB to be manufactured; determining an intermediate circuit layer between the first circuit layer and the second circuit layer based on distribution positions of the circuit layers of the PCB to be manufactured; setting conducting devices corresponding to the first circuit layer, the second circuit layer, and the intermediate circuit layer as metal conducting devices or semi-metal conducting devices; setting a conducting device corresponding to another circuit layer except the first circuit layer, the second circuit layer, and the intermediate circuit layer as a nonmetal conducting device; setting shapes of the conducting devices corresponding to the circuit layers of the PCB to be manufactured according to the shape information; assembling the conducting devices corresponding to the circuit layers of the PCB to be manufactured according to the distribution positions of the circuit layers of the PCB to be manufactured and obtaining the target conducting device.

The device for manufacturing a PCB in the embodiment of the present application includes a memory 201 and a processor 202. The memory 201 stores a computer program. The processor 202 executes the computer program to implement the following steps: parsing a type of the connection information; in case that the connection information represents that the first circuit layer is selectively connected with the second circuit layer and another circuit layer selectively connected with the first circuit layer is a third circuit layer, setting a conducting device corresponding to the third circuit layer as a semi-metal conducting device, setting all of the conducting devices corresponding to the first circuit layer, the intermediate circuit layer, and the second circuit layer as metal conducting devices; setting all of the conducting devices corresponding to the first circuit layer, the second circuit layer, and the intermediate circuit layer as metal conducting devices in case that the connection information represents that the first circuit layer is fully connected with the second circuit layer.

According to the device for manufacturing a PCB in the embodiment of the present application, a shape of the via is a cube, the preset conducting device is a columnar device.

The device for manufacturing a PCB in the embodiment of the present application includes a memory 201 and a processor 202. The memory 201 stores a computer program. The processor 202 executes the computer program to implement the following step: guiding the target conducting device into the via by injection.

According to the device for manufacturing a PCB in the embodiment of the present application, a structure of the preset conducting device is a hollow structure.

The device for manufacturing a PCB in the embodiment of the present application includes a memory 201 and a processor 202. The memory 201 stores a computer program. The processor 202 executes the computer program to implement the following step: injecting a conducting medium from one end to the other end of the target conducting device and obtaining the target PCB.

Figure 13:
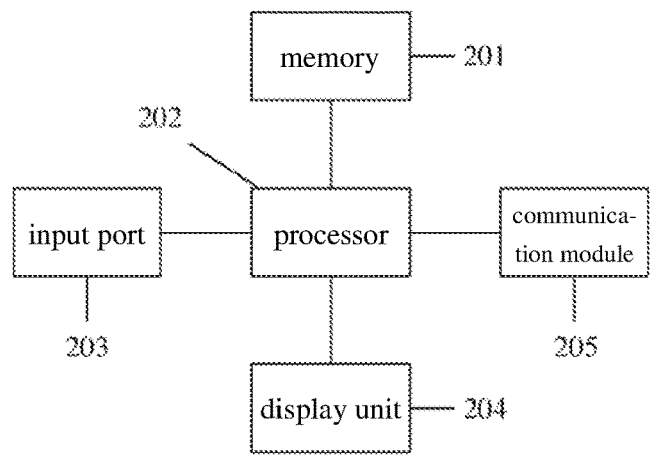
FIG. 13 is another schematic structural diagram of a device for manufacturing a PCB according to an embodiment of the present application.

Referring to FIG. 13, another device for manufacturing a PCB in the embodiment of the present application may further include: an input port 203 connected with the processor 202, configured to transmit an external input command to the processor 202; a display unit 204 connected with the processor 202, configured to display a processing result of the processor 202 to the outside; a communication module 205 connected with the processor 202, configured to implement communication between the device for manufacturing a PCB and the outside. The display unit 204 may be a display panel, a laser scanning display, etc. A communication mode used by the communication module 205 includes, but not limited to, High-definition Mobile Link (HML), Universal Serial Bus (USB), High-Definition Multimedia Interface (HDMI), and wireless connection, i.e., Wireless Fidelity (WiFi), Bluetooth communication, low-power Bluetooth communication, and IEEE802.11s-based communication.

The computer-readable storage medium provided in the embodiment of the present application stores a computer program which is executed by the processor to implement the following steps:

acquiring a PCB to be manufactured including a via;
acquiring shape information of the via;
acquiring connection information of each circuit layer in the PCB to be manufactured;
assembling preset conducting devices according to the connection information and the shape information and obtaining a target conducting device matched with the connection information and the shape information;
guiding the target conducting device into the via and obtaining a conducting PCB;
connecting the conducting PCB and obtaining a target PCB,
wherein a type of the preset conducting device includes a metal conducting device, a nonmetal conducting device, a semi-metal conducting device.

According to the computer-readable storage medium provided in the embodiment of the present application, a computer program is stored in the computer-readable storage medium, the computer program is executed by the processor to implement the following steps: determining, based on the connection information, an adjacent first circuit layer and second circuit layer to be connected in the circuit layers of the PCB to be manufactured; determining an intermediate circuit layer between the first circuit layer and the second circuit layer based on distribution positions of the circuit layers of the PCB to be manufactured; setting conducting devices corresponding to the first circuit layer, the second circuit layer, and the intermediate circuit layer as metal conducting devices or semi-metal conducting devices;

setting a conducting device corresponding to another circuit layer except the first circuit layer, the second circuit layer, and the intermediate circuit layer as a nonmetal conducting device; setting shapes of the conducting devices corresponding to the circuit layers of the PCB to be manufactured according to the shape information; assembling the conducting devices corresponding to the circuit layers of the PCB to be manufactured according to the distribution positions of the circuit layers of the PCB to be manufactured and obtaining the target conducting device.

According to the computer-readable storage medium provided in the embodiment of the present application, a computer program is stored in the computer-readable storage medium, the computer program is executed by the processor to implement the following steps: parsing a type of the connection information; in case that the connection information represents that the first circuit layer is selectively connected with the second circuit layer and another circuit layer selectively connected with the first circuit layer is a third circuit layer, setting a conducting device corresponding to the third circuit layer as a semi-metal conducting device, setting all of the conducting devices corresponding to the first circuit layer, the intermediate circuit layer, and the second circuit layer as metal conducting devices; setting all of the conducting devices corresponding to the first circuit layer, the second circuit layer, and the intermediate circuit layer as metal conducting devices in case that the connection information represents that the first circuit layer is fully connected with the second circuit layer.

According to the computer-readable storage medium provided in the embodiment of the present application, a shape of the via is a cube, the preset conducting device is a columnar device.

According to the computer-readable storage medium provided in the embodiment of the present application, a computer program is stored in the computer-readable storage medium, the computer program is executed by the processor to implement the following step: guiding the target conducting device into the via by injection.

According to the computer-readable storage medium provided in the embodiment of the present application, a structure of the preset conducting device is a hollow structure.

According to the computer-readable storage medium provided in the embodiment of the present application, a computer program is stored in the computer-readable storage medium, the computer program is executed by the processor to implement the following step: injecting a conducting medium from one end to the other end of the target conducting device and obtaining the target PCB.

The computer-readable storage medium involved in the present application includes a Random Access Memory (RAM), an internal memory, a Read-Only Memory (ROM), an electrically programmable ROM, an electrically erasable programmable ROM, a register, a hard disk, a removable disk, a Compact Disc Read-Only Memory (CD-ROM), or a storage medium in any other form well known in this art.

Descriptions about related parts in the system and device for manufacturing a PCB, and computer-readable storage medium provided in the embodiments of the present application refer to detailed descriptions about the corresponding parts in the method for manufacturing a PCB in the embodiments of the present application. Elaborations are omitted herein. In addition, the parts consistent with implementation principles of corresponding technical solutions in the prior art in the technical solutions provided in the embodiments of the present application are not described in detail, so as to avoid elaborations.

It is also to be noted that relational terms herein, such as first and second, are only for distinguishing an entity or operation from another entity or operation and do not necessarily require or imply the existence of any practical relation or sequence between these entities or operations. Moreover, terms "include" and "contain" or any other variation thereof is intended to cover nonexclusive inclusions, whereby a process, method, object, or device including a series of elements not only includes those elements but also includes other elements which are not clearly listed, or further includes elements intrinsic to the process, the method, the object, or the device. With no more restrictions, an element defined by statement "including a/an . . . " does not exclude the existence of the same other elements in a process, method, object, or device including the element.

The disclosed embodiments are described above to enable those skilled in the art to implement or use the present application. Various modifications to these embodiments are apparent to those skilled in the art. The general principles defined herein may be implemented in other embodiments without departing from the spirit or scope of the present application. Therefore, the present application will not be limited to these embodiments shown herein but is consistent with the largest scope consistent with the principles and novel characteristics disclosed herein.

What is claimed is:

1. A method for manufacturing a Printed Circuit Board (PCB), comprising:

acquiring a PCB to be manufactured comprising a via;

acquiring shape information of the via;

acquiring connection information of each circuit layer in the PCB to be manufactured;

assembling preset conducting devices according to the connection information and the shape information, and obtaining a target conducting device matched with the connection information and the shape information;

guiding the target conducting device into the via, and obtaining a conducting PCB;

connecting the conducting PCB, and obtaining a target PCB, wherein the preset conducting device comprises one or more of a metal conducting device, a nonmetal conducting device, or a semi-metal conducting device;

wherein the assembling preset conducting devices according to the connection information and the shape information and obtaining a target conducting device matched with the connection information and the shape information comprises:

determining, based on the connection information, an adjacent first circuit layer and second circuit layer to be connected in the circuit layers of the PCB to be manufactured;

determining an intermediate circuit layer between the first circuit layer and the second circuit layer based on distribution positions of the circuit layers of the PCB to be manufactured;

setting conducting devices corresponding to the first circuit layer, the second circuit layer, and the intermediate circuit layer as metal conducting devices or semi-metal conducting devices;

setting a conducting device corresponding to another circuit layer except the first circuit layer, the second circuit layer, and the intermediate circuit layer as a nonmetal conducting device;

setting shapes of the conducting devices corresponding to the circuit layers of the PCB to be manufactured according to the shape information; and assembling the conducting devices corresponding to the circuit layers of the PCB to be manufactured according to the distribution positions of the circuit layers of the PCB to be manufactured, and obtaining the target conducting device.

2. The method according to claim 1, wherein the setting conducting devices corresponding to the first circuit layer, the second circuit layer, and the intermediate circuit layer as metal conducting devices or semi-metal conducting devices comprises:

parsing a type of the connection information;

when the connection information represents that the first circuit layer is selectively connected with the second circuit layer and another circuit layer selectively connected with the first circuit layer is a third circuit layer, setting a conducting device corresponding to the third circuit layer as a semi-metal conducting device, and setting all of the conducting devices corresponding to the first circuit layer, the intermediate circuit layer, and the second circuit layer as metal conducting devices; and setting all of the conducting devices corresponding to the first circuit layer, the second circuit layer, and the intermediate circuit layer as metal conducting devices when the connection information represents that the first circuit layer is fully connected with the second circuit layer.

3. The method according to claim 2, wherein a structure of the preset conducting device is a hollow structure.

4. The method according to claim 1, wherein a shape of the via is a cube, and the preset conducting device is a columnar device.

5. The method according to claim 4, wherein a structure of the preset conducting device is a hollow structure.

6. The method according to claim 1, wherein the guiding the target conducting device into the via comprises:

guiding the target conducting device into the via by injection.

7. The method according to claim 6, wherein a structure of the preset conducting device is a hollow structure.

8. The method according to claim 1, wherein a structure of the preset conducting device is a hollow structure.

9. The method according to claim 8, wherein the connecting the conducting PCB and obtaining a target PCB comprises:

injecting a conducting medium from one end of the target conducting device to a second end of the target conducting device, and obtaining the target PCB.

10. A device for manufacturing a Printed Circuit Board (PCB), comprising:

a memory, configured to store a computer program; and a processor, configured to execute the computer program, wherein upon execution of the computer program, the processor is configured to perform operations comprising:

acquiring a PCB to be manufactured comprising a via;

acquiring shape information of the via;

acquiring connection information of each circuit layer in the PCB to be manufactured;

assembling preset conducting devices according to the connection information and the shape information, and obtaining a target conducting device matched with the connection information and the shape information;

guiding the target conducting device into the via, and obtaining a conducting PCB;

connecting the conducting PCB, and obtaining a target PCB, wherein the preset conducting device comprises one or more of a metal conducting device, a nonmetal conducting device, or a semi-metal conducting device;

wherein the assembling preset conducting devices according to the connection information and the shape information and obtaining a target conducting device matched with the connection information and the shape information comprises:

determining, based on the connection information, an adjacent first circuit layer and second circuit layer to be connected in the circuit layers of the PCB to be manufactured;

determining an intermediate circuit layer between the first circuit layer and the second circuit layer based on distribution positions of the circuit layers of the PCB to be manufactured;

setting conducting devices corresponding to the first circuit layer, the second circuit layer, and the intermediate circuit layer as metal conducting devices or semi-metal conducting devices;

setting a conducting device corresponding to another circuit layer except the first circuit layer, the second circuit layer, and the intermediate circuit layer as a nonmetal conducting device;

setting shapes of the conducting devices corresponding to the circuit layers of the PCB to be manufactured according to the shape information; and assembling the conducting devices corresponding to the circuit layers of the PCB to be manufactured according to the distribution positions of the circuit layers of the PCB to be manufactured, and obtaining the target conducting device.

11. The device for manufacturing a PCB according to claim 10, wherein the setting conducting devices corresponding to the first circuit layer, the second circuit layer, and the intermediate circuit layer as metal conducting devices or semi-metal conducting devices comprises:

parsing a type of the connection information;

when the connection information represents that the first circuit layer is selectively connected with the second circuit layer and another circuit layer selectively connected with the first circuit layer is a third circuit layer, setting a conducting device corresponding to the third circuit layer as a semi-metal conducting device, and setting all of the conducting devices corresponding to the first circuit layer, the intermediate circuit layer, and the second circuit layer as metal conducting devices; and setting all of the conducting devices corresponding to the first circuit layer, the second circuit layer, and the intermediate circuit layer as metal conducting devices when the connection information represents that the first circuit layer is fully connected with the second circuit layer.

12. The device for manufacturing a PCB according to claim 10, wherein a shape of the via is a cube, and the preset conducting device is a columnar device.

13. The device for manufacturing a PCB according to claim 10, wherein the guiding the target conducting device into the via comprises:

guiding the target conducting device into the via by injection.

14. A non-transitory computer-readable storage medium, storing a computer program which is executed by a processor, wherein upon execution of the computer program, the processor is configured to perform operations comprising:
   acquiring a Printed Circuit Board (PCB) to be manufactured comprising a via;
   acquiring shape information of the via;
   acquiring connection information of each circuit layer in the PCB to be manufactured;
   assembling preset conducting devices according to the connection information and the shape information, and obtaining a target conducting device matched with the connection information and the shape information;
   guiding the target conducting device into the via, and obtaining a conducting PCB;
   connecting the conducting PCB, and obtaining a target PCB,
   wherein the preset conducting device comprises one or more of a metal conducting device, a nonmetal conducting device, or a semi-metal conducting device;
   wherein the assembling preset conducting devices according to the connection information and the shape information and obtaining a target conducting device matched with the connection information and the shape information comprises:
      determining, based on the connection information, an adjacent first circuit layer and second circuit layer to be connected in the circuit layers of the PCB to be manufactured;
      determining an intermediate circuit layer between the first circuit layer and the second circuit layer based on distribution positions of the circuit layers of the PCB to be manufactured;
      setting conducting devices corresponding to the first circuit layer, the second circuit layer, and the intermediate circuit layer as metal conducting devices or semi-metal conducting devices;
      setting a conducting device corresponding to another circuit layer except the first circuit layer, the second circuit layer, and the intermediate circuit layer as a nonmetal conducting device;
      setting shapes of the conducting devices corresponding to the circuit layers of the PCB to be manufactured according to the shape information; and
      assembling the conducting devices corresponding to the circuit layers of the PCB to be manufactured according to the distribution positions of the circuit layers of the PCB to be manufactured, and obtaining the target conducting device.

15. The non-transitory computer-readable storage medium according to claim 14, wherein the setting conducting devices corresponding to the first circuit layer, the second circuit layer, and the intermediate circuit layer as metal conducting devices or semi-metal conducting devices comprises:
   parsing a type of the connection information;
   when the connection information represents that the first circuit layer is selectively connected with the second circuit layer and another circuit layer selectively connected with the first circuit layer is a third circuit layer, setting a conducting device corresponding to the third circuit layer as a semi-metal conducting device, and setting all of the conducting devices corresponding to the first circuit layer, the intermediate circuit layer, and the second circuit layer as metal conducting devices; and
   setting all of the conducting devices corresponding to the first circuit layer, the second circuit layer, and the intermediate circuit layer as metal conducting devices when the connection information represents that the first circuit layer is fully connected with the second circuit layer.

16. The non-transitory computer-readable storage medium according to claim 14, wherein a shape of the via is a cube, and the preset conducting device is a columnar device.

* * * * *